United States Patent
Jiang et al.

(10) Patent No.: US 9,401,330 B1
(45) Date of Patent: Jul. 26, 2016

(54) IC PACKAGE WITH NON-UNIFORM DIELECTRIC LAYER THICKNESS

(75) Inventors: Xiaohong Jiang, San Jose, CA (US); Hong Shi, San Jose, CA (US); Hui Liu, Pleasanton, CA (US); Yuanlin Xie, Fremont, CA (US)

(73) Assignee: Altera Corporation, San Jose, CA (US)

( * ) Notice: Subject to any disclaimer, the term of this patent is extended or adjusted under 35 U.S.C. 154(b) by 667 days.

(21) Appl. No.: 12/578,426

(22) Filed: Oct. 13, 2009

(51) Int. Cl.
*H01L 23/538* (2006.01)
*H01L 23/12* (2006.01)

(52) U.S. Cl.
CPC ............ *H01L 23/5383* (2013.01); *H01L 23/12* (2013.01)

(58) Field of Classification Search
CPC ... H01L 23/14; H01L 23/142; H01L 23/5383; H05K 1/024
USPC .................. 257/701, 758, E23.019, E23.062, 257/E23.145
See application file for complete search history.

(56) References Cited

U.S. PATENT DOCUMENTS

| 6,370,013 | B1 * | 4/2002 | Iino et al. | 361/306.3 |
| 6,417,460 | B1 * | 7/2002 | Cheng | 174/255 |
| 6,477,286 | B1 * | 11/2002 | Ouchi | 385/14 |
| 8,034,426 | B2 | 10/2011 | Shinkai et al. | |
| 2003/0151477 | A1 | 8/2003 | Hirabayashi et al. | 333/247 |
| 2008/0079159 | A1 | 4/2008 | Gupta et al. | 257/758 |
| 2008/0305293 | A1 | 12/2008 | Shinkai et al. | 428/64.5 |

FOREIGN PATENT DOCUMENTS

| CN | 1956635 A | 5/2007 | |
| JP | 2006-066810 | 3/2006 | H05K 3/46 |
| JP | 200666810 A | 3/2006 | |
| JP | 2006-294223 | 10/2006 | G11B 7/24 |
| JP | 2006294223 A | 10/2006 | |
| JP | 2008-540320 | 11/2008 | B32B 15/082 |
| JP | 2008540320 A | 11/2008 | |
| WO | 2006/124503 | 11/2006 | B32B 15/082 |

OTHER PUBLICATIONS

State Intellectual Property Office of P.R.C., First Office Action issued Feb. 24, 2014, CN201080046179.4.
International Search Report and Written Opinion of PCT/US2010/051880, mailed May 30, 2011.
Regarding related patents and patent applications, see the section of the accompanying IDS letter entitled "Related Patents and Patent Applications" for further information.

* cited by examiner

*Primary Examiner* — Laura Menz
*Assistant Examiner* — Candice Y Chan
(74) *Attorney, Agent, or Firm* — Okamoto & Benedicto LLP

(57) ABSTRACT

An integrated circuit (IC) package substrate with non-uniform dielectric layers is disclosed. The IC package substrate is a multilayer package substrate that has dielectric layers and metal layers stacked up alternately. The dielectric layers in the package substrate have different thickness. The metal layers may be ground, signal or power layers. A thicker dielectric layer is placed in between a signal layer and a power layer in the package substrate. The thicker dielectric layer may be at least twice as thick as other dielectric layers in the package substrate. The thicker dielectric layer may provide better impedance control in the package substrate.

10 Claims, 4 Drawing Sheets

| M1: Ground |
| D1: Dielectric |
| M2: Signal |
| D2: Dielectric |
| M3: Ground |
| D3: Dielectric |
| M4: Power |
| D4: Dielectric |
| M5: Ground |

| M1: Ground |
| D1: Dielectric |
| M2: Signal |
| D2: Dielectric |
| M3: Power |
| D3: Dielectric |
| M4: Ground |

IC PACKAGE WITH NON-UNIFORM DIELECTRIC LAYER THICKNESS

BACKGROUND

There are many types of different integrated circuit (IC) packages that cater to different applications. Some of the more common IC packages include flip chip and wire-bond ball grid array (BGA) packages. IC packages typically include an IC chip and other components like on-package de-coupling (OPD) capacitors placed on a substrate. The bottom surface of the substrate of a BGA package is usually filled with solder balls. These solder balls on the bottom of the IC package connect the IC package to a printed circuit board (PCB).

Signals from the IC chip are transmitted to the PCB through the substrate in the IC package and the solder balls on the bottom of the IC package. The substrate of the IC package generally contains a large number of horizontal and vertical transmission lines that connect the IC chip to the solder balls on the underside of the IC package. The substrate of the IC package is usually a multi-layer substrate that includes multiple power and ground layers and signal traces separated by dielectric layers.

Generally, the substrate layers are formed by having multiple dielectric and metal layers stacked alternately. Each of the metal layers may be a ground layer, a power layer or a signal layer. The metal layers are stacked such that the power layer and the signal layer will each have two ground layers, i.e., top and bottom, as reference layers. Signals from the IC chip are transmitted through the traces on the metal layers of the substrate to the solder balls at the bottom of the package before being routed out on the PCB.

Several factors affect signal integrity in an IC package, such as, impedance matching, crosstalk noise and return loss and insertion loss of the transmission paths. Single-ended signal traces need to have 50 Ohms characteristic impedance while differential signal traces need to have 100 Ohms characteristic impedance. For IC packages with a very high number of I/Os, dielectric layers of the IC packages need to be sufficiently thin to support narrow transmission traces in order to maintain the required impedance and to accommodate the high I/O density. For example, for a typical substrate with a dielectric thickness of 35 µm per layer, the trace width that is needed for the transmission traces to achieve a differential impedance of 100 Ohms is less than 20 µm. A thinner dielectric layer would require even narrower traces for better impedance matching. A thinner dielectric layer with narrow traces may also help reduce crosstalk between the traces. However, in most cases, there is a limit on how narrow the trace widths on the substrate layers can be and the narrowest trace width that can be achieved is generally more than 20 µm due to manufacturing constraints.

Therefore, it is desirable to have accurate impedance control without requiring a much narrower trace width. It is also desirable to be able to increase layer thickness as required without increasing crosstalk noise. It is within this context that the invention arises.

SUMMARY

Embodiments of the present invention include apparatuses and a method for creating an IC package substrate with a non-uniform dielectric layer thickness.

It should be appreciated that the present invention can be implemented in numerous ways, such as a process, an apparatus, a system, or a device. Several inventive embodiments of the present invention are described below.

In one embodiment, an IC package substrate is disclosed. The IC package substrate is a multi-layer substrate with dielectric and metal layers stacked alternately. The dielectric layers in the IC package substrate have different thickness. For example, some of the dielectric layers may be thicker than the rest of the dielectric layers in the IC package substrate. The metal layers consist of signal, ground and power layers. A thicker dielectric layer is placed in between the signal and power layers for impedance control purposes.

In another embodiment in accordance with the present invention, another IC package substrate is disclosed. The IC package substrate is a multi-layer substrate with multiple metal and dielectric layers. The package substrate can be divided into different regions, e.g., a high-speed serial interface (HSSI) region and a lower speed I/O region. The HSSI region, for example, may have thicker dielectric layers stacked alternately with the metal layers, while the other regions may have thinner dielectric layers stacked with the metal layers. In one embodiment, the dielectric layers in the HSSI region are twice as thick as the dielectric layers in the lower speed region. Two or more dielectric layers can be stacked together to form a thicker dielectric layer in the HSSI region of the IC package substrate in one embodiment.

In yet another embodiment, an IC package is disclosed. The IC package has an IC disposed on a surface of a package substrate. The package substrate has multiple regions. The first region of the package substrate consists of multiple metal and dielectric layers stacked alternately. Each of the dielectric layers in the first region has the same thickness. The second region of the package substrate consists of multiple metal layers stacked alternately with dielectric layers that have non-uniform thickness.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe apparatuses and a method for creating an IC package substrate with a non-uniform dielectric layer thickness.

It will be obvious, however, to one skilled in the art, that the present invention may be practiced without some or all of these specific details. In other instances, well-known operations have not been described in detail in order not to unnecessarily obscure the present invention.

The embodiments described herein provide techniques to create an IC package substrate with dielectric layers of varying thickness for better impedance control. One embodiment describes a package substrate with dielectric layers that do not necessarily have a uniform thickness across the whole substrate area. For example, dielectric layers in some parts of the substrate may be twice as thick as the layers in other parts of the substrate. In one embodiment, ground layers or ground planes that are normally placed one layer below transmission traces in the substrate are removed so that the dielectric thickness can be increased without increasing the package thickness. The increased dielectric thickness provides better impedance control. In another embodiment, the area of the substrate with high speed serial interface (HSSI) transmission lines have thicker dielectric layers compared to other areas of the substrate with lower speed transmission lines.

Figure 1:
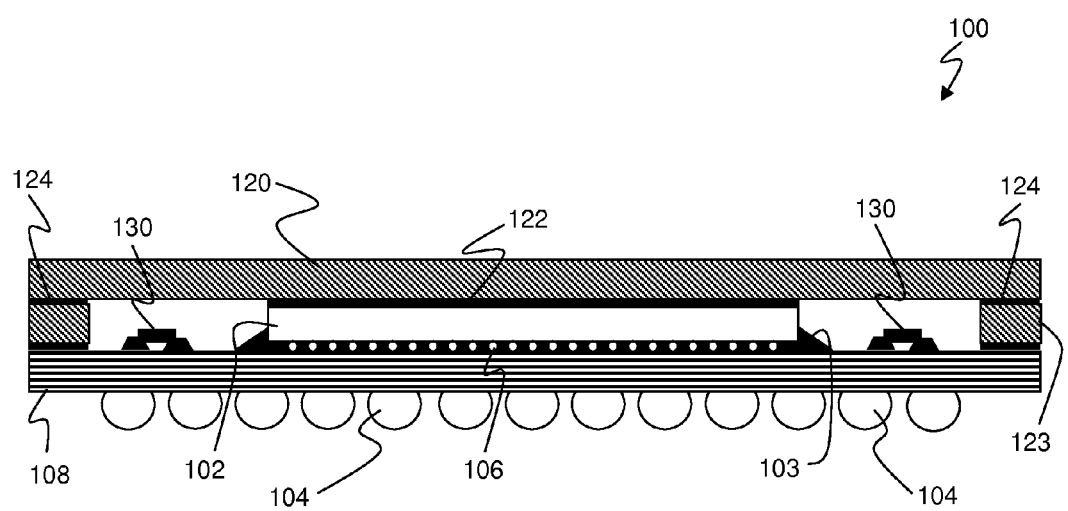
FIG. 1, meant to be illustrative and not limiting, shows an exemplary flip chip BGA IC package.

FIG. 1, meant to be illustrative and not limiting, shows an exemplary flip chip BGA IC package 100. IC 102, placed on one side of package substrate 108, is flipped and is connected to package substrate 108 through solder bumps 106. The cavity between package substrate 108 and solder bumps 106 is filled with underfill 103. Underfill 103 is a sealing resin that is used to fill the gap and protect the solder joints between solder bumps 106 and package substrate 108. Passive components, e.g., OPD capacitors 130, may be placed on package substrate 108, around IC 102. Thermal interface material (TIM) 122 is placed in between IC 102 and lid 120 for better heat dissipation. Lid 120 is attached to and supported by stiffener 123 through adhesive 124. Solder balls 104 are disposed on an opposite side of package substrate 108. Signals from IC 102 travel through solder bumps 106, package substrate 108 and solder balls 104 to outside of IC package 100. IC package 100 may be mounted on a printed circuit board (PCB). Substrate 108, through solder bumps 106 and solder balls 104, electrically connects IC 102 to the PCB that IC package 100 is mounted on. In one embodiment, substrate 108 is a multilayer substrate that is formed by metallization and dielectric layers stacked alternately.

Figure 2A:
FIG. 2A, meant to be illustrative and not limiting, shows a simplified schematic diagram depicting layers in an exemplary multilayer package substrate structure.

FIG. 2A, meant to be illustrative and not limiting, shows an exemplary package substrate structure 200. One skilled in the art should appreciate that FIG. 2A is a simplified figure showing the multiple metal and dielectric layers in a multilayer package substrate. As such, other components in a package substrate, e.g., vias, transmission traces, solder bumps, solder balls, etc., are not shown in FIG. 2A. In one embodiment, package substrate structure 200 may be a package substrate for an IC package similar to IC package 100 of FIG. 1. Substrate structure 200 has multiple dielectric D1-D4 and metal M1-M5 layers stacked alternately. Ground planes GND are put on metal layers M1, M3 and M5 while signal layer and power layer are put on metal layers M2 and M4, respectively. A dielectric layer D1-D4 is placed in between every metal layer M1-M5. Dielectric layers D1-D4 are non-conducting layers made of non-conducting materials, e.g., ceramic, organic, or oxide. In the illustrative embodiment of FIG. 2A, dielectric layers D1-D4 have the same thickness. In one known arrangement, each of dielectric layers D1-D4 is approximately 35 μm thick. Even though only five metal layers and four dielectric layers are shown in package substrate structure 200, one skilled in the art should appreciate that fewer or more metal and dielectric layers may be used in a package substrate. For an IC package with a high I/O count, e.g., a memory interface IC package, the package substrate may need to have multiple signal layers. If each signal layer requires a ground reference on both sides, i.e., top and bottom, then the layer count on the package substrate would increase substantially.

Figure 2B:
FIG. 2B, meant to be illustrative and not limiting, shows an alternative multilayer package substrate structure as to the structure of FIG. 2A.

FIG. 2B, meant to be illustrative and not limiting, shows package substrate structure 250 as one embodiment in accordance with the present invention. For the sake of brevity, elements already shown in FIG. 2A and described above are not repeated. In the embodiment of FIG. 2B, each of signal layer M2 and power layer M3 requires only one ground layer, i.e., M1 and M4, respectively, as a reference layer. Compared to package substrate structure 200 of FIG. 2A, the embodiment of FIG. 2B requires one less metal layer and one less dielectric layer. In the embodiment of FIG. 2B, the dielectric layers D1 and D3 in package substrate structure 250 have a different thickness, relative to dielectric layer D2. In the illustrative embodiment of FIG. 2B, dielectric layer D2, i.e., the dielectric layer between signal layer M2 and power layer M3, is at least twice as thick as each of dielectric layers D1 and D3. The crosstalk in signal layer M2 is kept relatively low due to the relatively large dielectric thickness ratio as only the thickness of dielectric layer D2 between the signal layer M2 and power layer M3 is increased. In the embodiment of FIG. 2B, the relatively thicker dielectric layer D2 minimizes crosstalk between signal and power layers, M2 and M3, respectively. The impedance of the signals can also be maintained with the relatively large dielectric thickness ratio. Crosstalk can also be minimized by further optimizing the width of the signal traces, to increase the spacing between the signal traces, in signal layer M2. Even though a few layers are shown in the embodiment of FIG. 2B, one skilled in the art should appreciate that more or fewer layers can be used in this context. One skilled in the art should also appreciate that the order of the metal layers shown in the embodiment of FIG. 2B can be switched. For example, metal layer M2 may be a power layer and metal layer M3 may be a signal layer.

Figure 3A:
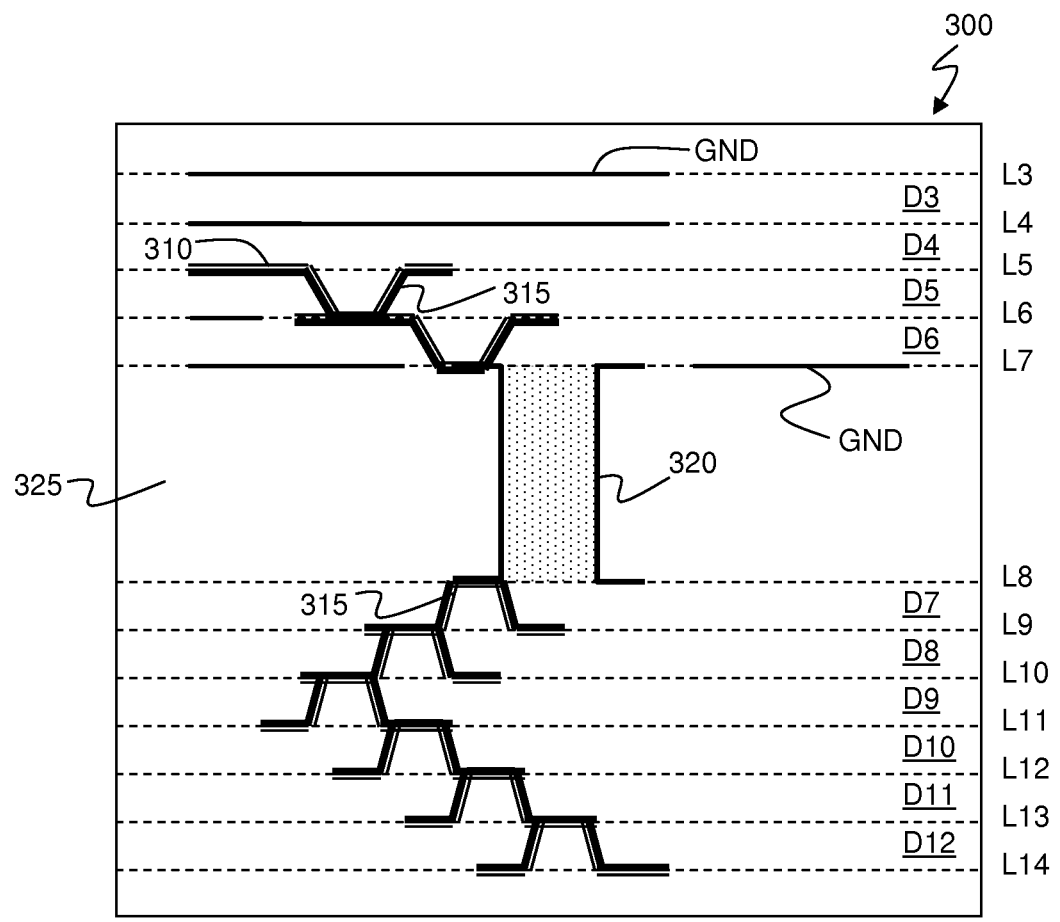
FIG. 3A, meant to be illustrative and not limiting, shows a cross sectional view of an exemplary multilayer package substrate structure with micro-vias, plated through holes (PTH) and signal traces.

FIG. 3A, meant to be illustrative and not limiting, shows an exemplary package substrate structure 300. The illustrative embodiment of FIG. 3A is a more detailed representation of a package substrate used in various IC packages, e.g., package substrate 108 of IC package 100 in FIG. 1. Generally, a multilayer ball grid array (BGA) package includes bumps, transmission lines, micro-vias, plated through holes (PTH) and BGA balls. However, one skilled in the art should appreciate that some components, e.g., bumps, and BGA balls, are not shown in FIG. 3A for illustrative purposes. Metal layers L3-L14, represented by dotted lines in FIG. 3A, are stacked alternately with dielectric layers D3-D12. Ground planes GND, shown as solid lines, are placed on metal layer L3, L4, L6 and L7 in one embodiment. Transmission lines or traces 310 are laid out on metal layer L5. In one embodiment, traces 310 are made of copper and may be etched or plated on package substrate structure 300. Micro-vias 315 connect each of metal layers L3-L14 of package substrate structure 300. One skilled in the art should appreciate that signal transmissions through traces 310 are also known as horizontal transitions while via to via, via to ball and ball to printed circuit board (PCB) vias are known as vertical transitions. PTH 320 is drilled through core 325 of package substrate 300. An IC chip may be mounted on top of package substrate structure 300 and signals from the IC chip are transmitted by transmission lines 310 through micro-vias 315 and PTH 320 to the bottom of package substrate structure 300. Solder balls, e.g., solder balls 104 of FIG. 1, may be placed on the bottom of package substrate structure 300 to transmit signals out of the IC package.

Referring still to FIG. 3A, to accommodate an IC with a high I/O count, each of dielectric layers D3-D12 needs to be sufficiently thin to accommodate the large number of I/O traces and to achieve the required impedance value. At the same time, narrower transmission lines are required to achieve the same level of impedance with a thinner dielectric layer. As the traces are narrower, more traces can be included within the same space area. In one known arrangement, each of dielectric layers D3-D12 is approximately 35 µm thick. Thus, based on the exemplary embodiment of FIG. 2A where each of dielectric layers D1-D4 is approximately 35 µm, the width of traces 310 in signal layer L2 needs to be less than 20 µm in order to achieve a differential impedance value relatively close to 100 Ohms. However, in most cases, the minimum feasible trace width is relatively much wider than 20 µm. In an exemplary embodiment, the trace width of signal traces 310 in signal layer L2 is close to 25 µm, to maintain the edge roughness of the photoresist that is used to pattern the signal traces. As the minimum feasible trace width is relatively wider than the required trace width, the resulting impedance value is substantially lower than the required impedance.

Figure 3B:
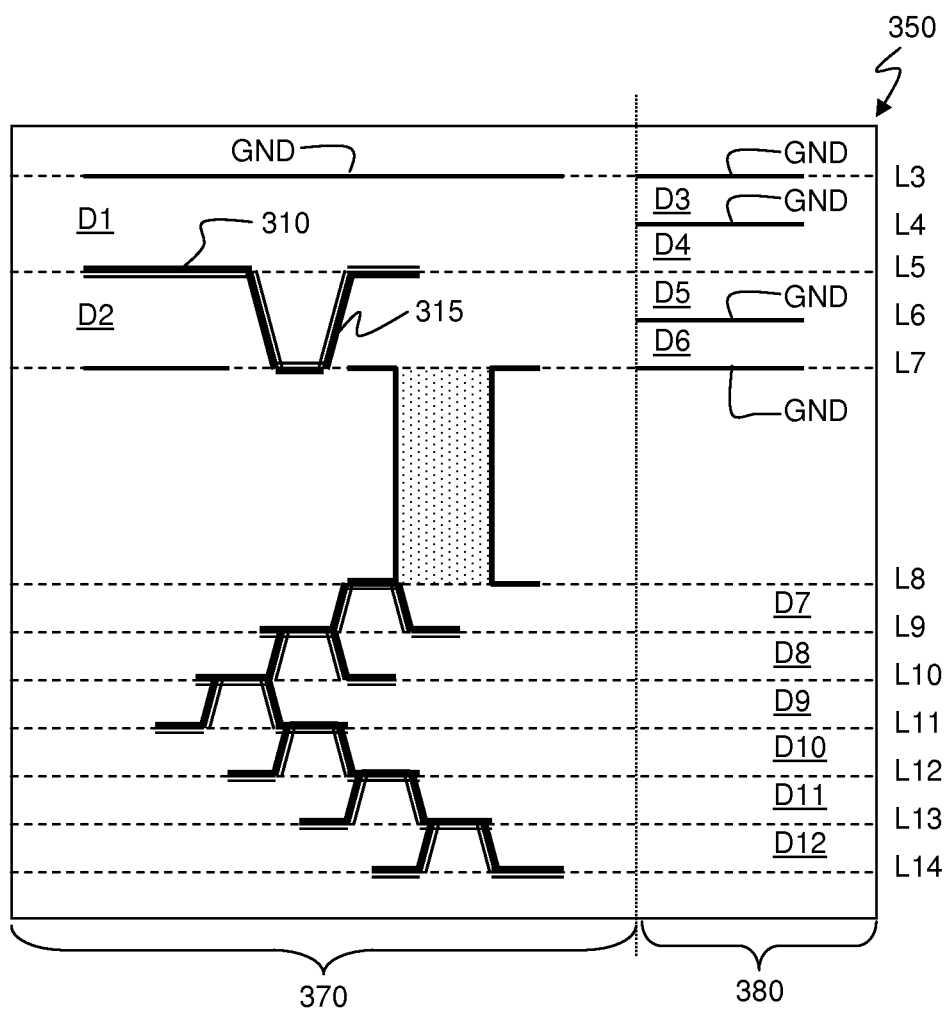
FIG. 3B, meant to be illustrative and not limiting, shows an alternative cross sectional view of a multilayer package substrate with non-uniform dielectric layers as one embodiment in accordance with the present invention.

FIG. 3B, meant to be illustrative and not limiting, shows multilayer package substrate 350 as one embodiment in accordance with the present invention. For the sake of brevity, elements already shown in FIG. 3A and described above are not repeated. To accommodate different functionalities, package substrate structure 350 is divided into two regions, i.e., a high speed serial interface (HSSI) region 370 and a non-HSSI, i.e., a lower speed fabric I/O, region 380. In one embodiment, the HSSI region 370 supports signals of up to 25 Gigabit per second. High speed signals are routed through the HSSI region 370 of package substrate 350 while lower speed signals are routed through region 380. In the embodiment of FIG. 3B, both HSSI region 370 and non-HSSI region 380 are adjacent to each other. Dielectric layers D1-D12 in package substrate 350 are non-uniform. In other words, dielectric layers D1-D12 may have a different thickness across package substrate 350. In the illustrative embodiment of FIG. 3B, dielectric layers D1 and D2 in HSSI region 370 are relatively thicker than dielectric layers D3-D6 in region 380. In one embodiment, the height of each of dielectric layers D1 and D2 in region 370 is approximately twice of the height of each of dielectric layers D3-D6 in region 380. In the illustrative embodiment of FIG. 3B, a ground plane GND is placed in between each dielectric layer in region 380. In the embodiment of FIG. 3B, dielectric layers D1 and D2 of region 370 are of the same thickness of two dielectric layers of region 380 stacked on top of each other. For example, the height of dielectric layers D3-D6 in region 380 is approximately 25 µm and the height of dielectric layers D1 and D2 is approximately 50 µm in one embodiment. In one embodiment, because the height of each of dielectric layers D1 and D2 is doubled, fewer metal layers are needed in region 370 compared to region 380. The thickness of the substrate in both regions 370 and 380 can also be maintained as the thicker dielectric layers in region 370 make up for the difference in the number of dielectric layers. Signal traces 310 are placed on metal layer L5. In one embodiment, signal traces 310 may be differential or single-ended transmission lines that are at least 25 µm wide with an impedance value close to 100 Ohms and 50 Ohms, respectively.

The described embodiments provide improved impedance control by using thicker dielectric layers in different regions of a package substrate where impedance control is important. An improved differential impedance can be achieved with some of the embodiments disclosed without increasing signals crosstalk in other areas of the IC package because the layer thickness is only increased in certain regions of the package substrate, e.g., the HSSI region. Other regions or traces that do not require tight impedance control may still retain or use a thinner dielectric layer. For example, in one of the disclosed embodiments, by stacking up two dielectric layers, a close to 95 Ohms differential impedance can be achieved with an improvement in return loss. The width of the signal traces in the IC package can also be preserved by using a thicker dielectric layer.

One skilled in the art will appreciate that specific wirebond and flip chip packages with a ball grid array are provided in the exemplary illustrations of FIGS. 1A and 1B. However, this is not meant to be limiting as the techniques described herein may be applied to other packaging configurations, e.g., heat spreader ball grid array (HSBGA), low profile ball grid array (LBGA), thin fine pitch ball grid array (TFBGA), flip chip chip-scale package (FCCSP), etc.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit (IC) package substrate comprising:
a first ground layer, a signal layer, and a second ground layer;
a first section comprising a plurality of metal layers stacked alternately with a first plurality of dielectric layers, the plurality of metal layers comprising a portion of the first ground layer, a portion of the signal layer and a portion of the second ground layer, wherein at least one of the first plurality of dielectric layers has a first thickness substantially different than a second thickness of remaining dielectric layers and wherein one and only one of the at least one of the first plurality of dielectric layers is disposed between and contacting the signal layer and the first ground layer of the IC package substrate; and
a second section comprising a second plurality of dielectric layers with a consistent thickness, wherein the second plurality of dielectric layers excludes the at least one of the first plurality of dielectric layers having the first thickness, and wherein two of the second plurality of dielectric layers, with a third metal layer therebetween and contacting each of the two of the second plurality of dielectric layers, are disposed between and contacting the signal layer and the first ground layer of the IC package substrate.

2. The IC package substrate of claim 1, wherein the first thickness of the at least one of the first plurality of dielectric layers is at least twice the second thickness of the remaining dielectric layers.

3. The IC package substrate of claim 1, wherein the signal layer comprises a plurality of high speed transmission traces.

4. The IC of claim 3, wherein the first section and the second section are adjacent to each other and wherein a top layer of the package substrate extends across a top of the first section and a top of the second region and the top layer is coplanar with the top of the first section and the top of the second section.

5. An integrated circuit (IC) package, comprising:
a package substrate having a first region with a plurality of metal layers interleaved with a first plurality of dielectric layers, the first plurality of dielectric layers having a first thickness, and a second region with a plurality of metal layers interleaved with a second plurality of dielectric layers, at least one of the second plurality of dielectric layers having a second thickness different than the first thickness, a first metal layer as a ground layer of the first region, a first one of the first plurality of dielectric layers, a second metal layer of the first region, a second one of the first plurality of dielectric layers, and a third metal layer as a signal layer of the first region contiguous in a vertical direction, a first metal layer as a ground layer of the second region, one and only one of the at least one of the second plurality of dielectric layers, and a second metal layer as a signal layer of the second region contiguous in the vertical direction, the first metal layer of the first region and the first metal layer of the second region contiguous in a lateral direction, the third metal layer of the first region and the second metal layer of the second region contiguous in the lateral direction, wherein the first region and the second region are adjacent to each other in the lateral direction, wherein a single top layer of the package substrate functions as a top of the first region and a top of the second region and the top layer is coplanar with the top of the first region and the top of the second region, and wherein the first region excludes the at least one of the second plurality of dielectric layers having the second thickness; and
an IC disposed on a surface of the package substrate.

6. The IC package of claim 5, wherein the IC package is a flip-chip package.

7. The IC package of claim 5, further comprising a plurality of transmission traces on at least one of the metal layers in the second region.

8. The IC package of claim 7, wherein the second region is a high speed serial interface (HSSI) region and the plurality of transmission traces is a plurality of HSSI transmission lines.

9. The IC package of claim 5, wherein a thickness of the first plurality of dielectric layers in the first region is less than 30 µm and wherein a second thickness of the at least one of the second plurality of dielectric layers in the second region is at least double the thickness of the first plurality of dielectric layers in the first region.

10. The IC package of claim 9, wherein a number of metal layers in the second region is reduced due to the second thickness of the at least one of the second plurality of dielectric layers in the second region.

* * * * *